Dec. 2, 1958 V. P. MATHIS ET AL 2,863,045

SEMICONDUCTOR MIXING CIRCUITS

Filed April 29, 1955

INVENTORS:
VERNON P. MATHIS,
JEROME J. SURAN,
BY George V. Eltgroth
THEIR ATTORNEY.

United States Patent Office 2,863,045

Patented Dec. 2, 1958

2,863,045

SEMICONDUCTOR MIXING CIRCUITS

Vernon P. Mathis and Jerome J. Suran, Syracuse, N. Y., assignors to General Electric Company, a corporation of New York Application April 29, 1955, Serial No. 504,958

5 Claims. (Cl. 250—20)

This invention relates to signal mixing and converter networks and more particularly, to networks of this character utilizing semiconductor devices.

The semiconductor device used by this invention consists of a single rectifying junction made to a bar of semiconductor material which has in addition at least two ohmic contacts. The rectifying junction may be formed by fusing a dot of donor or acceptor material to a semiconductor bar of proper composition by techniques now well known in the art. By this method, a P–N or N–P rectifying junction may be formed. Assuming an acceptor dot on an N-type bar, if the P-region of this junction is made positive with respect to the N-region opposite, the junction is biased in the forward direction and holes are injected into the N-type region from the P-region. With this type of bias, the P-region is acting as an emitter and the diode is biased in its easy direction of current flow. If the P-region is biased negatively with respect to the N-region, little current will flow. If a biasing potential is applied between two ohmic contacts, a transverse electric field is established over the bar of semiconductor material. With the junction biased forwardly, the holes injected into the bar drift toward its negative end under influence of the electric field. This lowers the resistivity in the end of the bar between the junction and the negative ohmic electrode and is primarily responsible for the negative resistance characteristic exhibited by the described semiconductor device. For further details concerning the semiconductor device utilized in this invention, reference may be made to the applications by I. A. Lesk, Serial Number 341,164, filed March 9, 1953, now Patent No. 2,769,926 granted Nov. 6, 1956 and J. M. Engel, Serial Number 373,828, filed August 12, 1953, which are assigned to the assignee of the present application.

It has been found that, with proper cooperating circuitry, the aforesaid semiconductor device may be utilized for performing mixing and/or converting functions. Therefore, an object of the present invention is to provide a new and improved mixer circuit using a semi-conductor device which has only a single rectifying junction.

It is a further object of this invention to provide a new and improved semiconductor mixing circuit which allows comparatively simple and durable construction.

Another object of the present invention is to provide a new and improved semiconductor converter circuit which combines simple and durable construction with efficient operation.

These and other advantages of the invention will be more clearly understood from the following description taken in connection with the accompanying drawings and its scope will be apparent from the appended claims.

Figure 1:
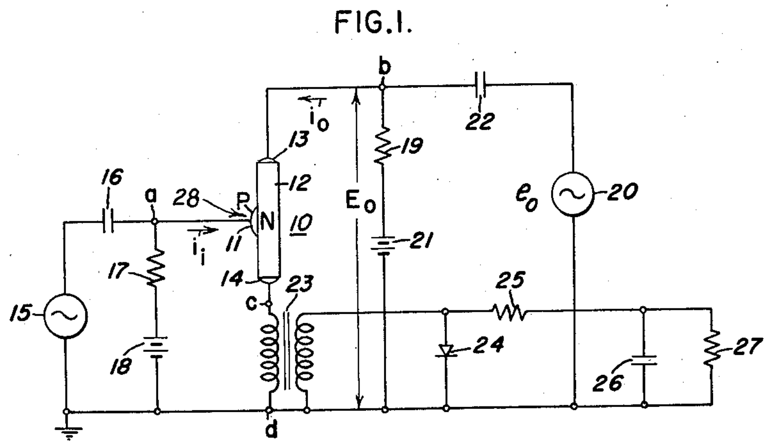
Figure 2:
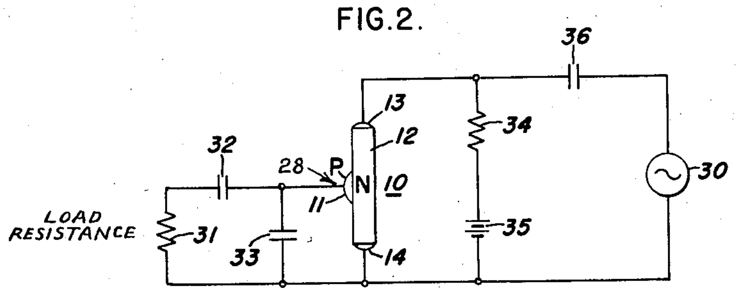

In the drawings, Figures 1 and 2 are diagrammatic illustrations of the invention.

Figure 1 utilizes the non-linear characteristic of semiconductor 10 in a mixing circuit. Semiconductor 10 consists of a bar 12 of semiconducting material, such as N-type silicon or germanium, having ohmic electrodes 13 and 14 attached to spaced points thereon, and a rectifying junction 11 which consists of an indium dot fused to a portion of the bar 12 within the region affected by the electric field between electrodes 13 and 14. A biasing potential is supplied to the electrode 28 of junction 11 by a source of potential 18 connected in series with a resistance 17. Another biasing potential, furnished by a source of potential 21 in series with a resistance 19, is connected between ohmic contacts 13 and 14 through the primary winding of a transformer 23. A first signal source 15 excites the junction 11 of semiconductor 10 through the coupling capacitor 16. Another signal source 20 having a frequency other than that of signal source 15 applies energy across ohmic electrodes 13 and 14 of semiconductor 10. Coupling capacitor 22 couples signal source 20 to ohmic electrode 13. The signal generators 15 and 20 generate waveforms having frequencies of $\omega_1$ and $\omega_2$ respectively. The primary of transformer 23 is shown connected between points *c* and *d* in the grounded base circuit of semiconductor 10 and illustrates a method for extracting the mixed signal produced by semiconductor 10. The mixed signal is coupled to a detector circuit, represented here by the simple combination of diode 24, connected across the secondary of transformer 23, resistance 25, connected in series with load resistance 27 and capacitance 26 in shunt with the load 27. The detector circuit is conventional and illustrative of one manner in which an output signal may be utilized. It does not constitute a necessary part of this invention.

The operating point of semiconductor 10 may be set by varying potential of sources 18 and 21 and the magnitude of resistances 17 and 19. When the junction 11 is biased in the forward direction, minority carriers are injected into the bar 12 which lowers the resistivity in the bar between junction 11 and ohmic contact 14. By applying a signal from the signal generator 20 across the bar 12, and by applying a signal from signal generator 15 to junction 11, the signal from signal generator 15 varies the resistivity of the bar 12 to effectively mix the two applied signals. While the mixed signal is coupled to the detector circuit by transformer 23 in the illustration, transformer 23 does not constitute the only means which may be used to derive the mixed signal. The mixed signal may also be detected between points *a* and *d* or between points *b* and *d* or between points *a* and *b*. However, the use of transformer 23 isolates the mixed signal from the circuits containing the signal generators 15 and 20.

The mixing action may be explained by considering the voltages and currents with respect to semiconductor 10. For the small signal case, the output current ($i_o$) is given by:

$$i_o = KE_o\sigma \qquad (1)$$

where K is a constant, $E_o$ the interbase voltage and $\sigma$ the conductivity of semiconductor 10. The conductivity is related to the input or junction current ($i_i$) by:

$$\sigma = gi_i \qquad (2)$$

where *g* is a constant.

Therefore, $$i_o = (gK)E_oi_i \qquad (3)$$

Assuming that:

$$e_o = E_{om} \sin \omega_1 t \qquad (4)$$

and $$i_i = I_i \sin \omega_2 t \qquad (5)$$

Then, $$i_o = (gK)E_{om} \sin \omega_1 t I_i \sin \omega_2 t \qquad (6)$$

or $$i_o = [A] \sin \omega_1 t \sin \omega_2 t$$

where A is a new constant composed of $$E_{om}, I_i, g \text{ and } K$$

From Equation 6 it can be seen that one of the product terms comprises a difference frequency $(\omega_1-\omega_2)$ and another term involves the sum frequency $(\omega_1+\omega_2)$, demonstrating the desired mixing action.

From the above explanation, it can be seen that it is possible to mix two signals in the semiconductor 10 by applying one signal as a voltage or current to the junction 11 of semiconductor 10 and by applying a second signal as a potential across the bar 12 of transistor 10.

Although it has been indicated that junction 11 of semiconductor 10 is biased forwardly in Fig. 1, mixing action may also be obtained with junction 11 biased in a reverse direction. In this case, a field is established contiguous to the junction 11. This field varies in accordance with the signal applied from signal generator 15. The resulting mixing action occurs due to the varying field which modulates the distribution of electric field gradient across bar 12 provided by the biasing potential from source 21 and from the varying signal voltage from signal generator 20. The mixed output signal is then derived and utilized as previously set forth.

Figure 2 shows the use of semiconductor 10 as a converter. This circuit makes use of the negative input characteristic of the semiconductor 10, which allows self-oscillation. A capacitance 33 is connected between junction electrode 28 and ohmic contact 14 of semiconductor 10. A biasing potential provided by source 35 and resistance 34 is applied across the bar 12 between ohmic contacts 13 and 14 of semiconductor 10. A signal generator 30 has one terminal coupled to ohmic contact 13 through a coupling capacitor 36, the other terminal connected to ohmic contact 14. A coupling capacitor 32 is utilized to deliver an output signal across load resistance 31. With a biasing potential across the bar 12, the capacitance 33 charges through the back resistance of junction 11. The charging time of capacitance 33 depends upon the value of capacitance and the back resistance of junction diode 11. As this charge increases, the P-region of junction 11 becomes positive with respect to at least a portion of the N-region and holes are injected into the base portion near ohmic contact 14. This reduces the resistivity of this region diminishing the bar potential in the vicinity of the junction and allows the capacitor to discharge through the forward resistance of the junction diode 11. Sustained oscillations are thus developed by operating semiconductor 10 in its negative resistance region. The frequency of these oscillations is a function of the capacitance 33 and the back resistance of junction 11. By applying another signal of different frequency from signal generator 30 across the bar 12, a mixing action takes places as previously described between the signal provided by the signal generator 30 and the signal provided by the oscillation of semiconductor 10. The sum and difference frequencies obtained from this mixed signal may be coupled by a coupling capacitor 32 to the load resistance 31. The desired frequency may then be obtained by using a conventional detector such as that shown in Figure 1, or by any conventional detector means in conjunction with frequency selective networks, if desired.

Although semiconductor device 10 is shown and described having a P–N junction, it will appear obvious to those skilled in the art that an N–P junction may be used by reversing the polarities of the biasing potentials.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What we claim as new and desire to secure by Letters Patent of the United States is:

1. In combination, a semiconductor device having a bar of semiconductor material of one type having first and second ohmic electrodes at spaced points thereon, and a region of opposite conductivity type intermediate said ohmic electrodes forming a semiconductor junction with said bar, and a junction electrode, means for applying a first biasing potential between said junction electrode and said second ohmic electrode, means for applying a first signal between said junction electrode and said second ohmic electrode, means for applying a second biasing potential between said ohmic electrodes, means for applying a second signal of different frequency than said first signal between said ohmic electrodes, and means for obtaining modulation product signal generated by the mixing of said first and said second signals by said semiconductor device, said means including a transformer connected in circuit with said first ohmic electrode.

2. In combination, a three electrode semiconductor device having a bar of semiconductor material of one type having first and second ohmic electrodes at spaced points thereon, and a region of opposite conductivity type intermediate said ohmic electrodes forming a single semiconductor junction with said bar, means for applying a biasing potential to said bar connected between said ohmic electrodes, means for applying a first signal between said junction and one of said ohmic electrodes, a second signal supply source, said second signal being of a frequency other than that of said first signal and means for applying said second signal between said ohmic electrodes, and output means providing the modulation product signal generated by the mixing of said first and said second signals by said semiconductor device.

3. In combination, a three electrode semiconductor device having a bar of semiconductor material of one type having first and second ohmic electrodes at spaced points thereon, and a region of opposite conductivity type intermediate said ohmic electrodes forming a single semiconductor junction with said bar, means for applying a first biasing potential between said junction and said first ohmic electrode, means for applying a first signal between said junction and said first ohmic electrode, means for applying a second biasing potential between said ohmic electrodes, means for applying a second signal of different frequency than said first signal between said ohmic electrodes, and output means for obtaining an algebraic sum frequency signal produced by the mixing of said first and said second signals by said semiconductor device.

4. In combination, a three electrode semiconductor device having a negative resistance characteristic comprising a bar of semiconductor material of one type having first and second ohmic electrodes at spaced points thereon, and a region of opposite conductivity type intermediate said ohmic electrodes forming a single semiconductor junction with said bar, means for applying a biasing potential between said ohmic electrodes, means for applying another potential between said junction and one of said ohmic electrodes, whereby said semiconductor device is biased to present a negative resistance therebetween, means for applying a first signal between said junction and said one ohmic electrode, means for applying a second signal of different frequency than said first signal between said ohmic electrodes, and output means for obtaining an algebraic sum or difference frequency signal produced by the mixing of said first and said second signals by said semiconductor device.

5. In a signal responsive network, a three electrode semiconductor device having a negative resistance characteristic comprising a bar of semiconductor material of one type having first and second ohmic electrodes at spaced points thereon and a region of opposite conductivity type intermediate said ohmic electrodes forming a single rectifying junction with said bar, means for applying a biasing potential along said bar connected between said first ohmic electrode and a terminal point, means for applying a first signal between said junction and said terminal point, means for applying a second signal between said first ohmic electrode and said terminal point, said second signal being of a frequency other than that of said first signal, impedance means connected between said second ohmic electrode and said terminal point, and output means providing an algebraic sum frequency signal produced by the mixing of said first and said second signal by said semiconductor device, said output means being connected to said impedance means.

References Cited in the file of this patent

UNITED STATES PATENTS 2,600,500 Haynes et al. ------------ June 17, 1952

OTHER REFERENCES

Pub. (I) "Transistors Theory and Practice" by Turner, pp. 12–13, published April 2, 1954.